United States Patent [19]

Kim

[11] Patent Number: 5,794,798

[45] Date of Patent: Aug. 18, 1998

[54] WAFER HOLDER

[75] Inventor: Dong-Ho Kim, Kyungki-do, Rep. of Korea

[73] Assignee: Samsung Electronics Co., Ltd., Suwon, Rep. of Korea

[21] Appl. No.: 760,254

[22] Filed: Dec. 5, 1996

[30] Foreign Application Priority Data

Dec. 29, 1995 [KR] Rep. of Korea ................ 1995-65735

[51] Int. Cl.⁶ .................................................. A47G 19/08
[52] U.S. Cl. ................................ 211/41.18; 108/157.18
[58] Field of Search ............................... 211/41, 41.17, 211/41.18; 108/157.17, 157.18, 153.1; 206/451, 456

[56] References Cited

U.S. PATENT DOCUMENTS

| | | |
|---|---|---|
| 2,650,269 | 8/1953 | Webb ........................................ 206/451 |
| 4,569,452 | 2/1986 | Schulke ................................. 211/41.18 |
| 5,016,142 | 5/1991 | White .................................... 211/41.18 |
| 5,048,679 | 9/1991 | Thomas .................................. 206/451 |
| 5,669,513 | 9/1997 | Oh et al. ............................... 211/41.18 |

*Primary Examiner*—Peter M. Cuomo
*Assistant Examiner*—Gerald A. Anderson
*Attorney, Agent, or Firm*—Jones & Volentine, L.L.P.

[57] ABSTRACT

A wafer holder is provided which more stably supports a transferred wafer and prevents interference between a wafer stopper and other elements of the wafer holder. The wafer holder includes a wafer guiding section having a centrally and inwardly inclined surface for stably guiding a wafer, a wafer support section formed at an inner side of the wafer guiding section and having a wider width for more stably supporting the wafer, and a pair of spaced-apart rectangular wafer stopper holes formed between the wafer guiding section and the wafer support section, and having a predetermined size that is wider in the circumferential direction of the wafer support section than in the radial direction. The wafer holder acts to prevent interference between the wafer stopper and other elements when the wafer stopper and the arm move up and down.

5 Claims, 2 Drawing Sheets

WAFER HOLDER

BACKGROUND OF THE INVENTION

The present invention relates to a wafer holder. More particularly, the present invention relates to an improved wafer holder that is capable of more stably holding and supporting a wafer as the wafer is being transferred to a processing chamber.

In a conventional semiconductor fabricating process, a wafer holder is used for loading/unloading a wafer to/from a processing chamber and for stably holding and supporting the wafer during a wafer transfer process.

FIG. 1 illustrates a conventional wafer holder adapted in a cleaning chamber of a sputtering system which was introduced by the Anelva company, Japan. This conventional wafer holder 10 is made of a silicon oxide material through a molding process. The wafer holder 10 includes a wafer guiding section 4, a wafer support section 6, and a wafer stopper hole 8. The wafer guiding section 4 has a surface centrally and inwardly inclined at a predetermined angle. The wafer support section 6 is centrally formed at an inner side of the wafer guiding section 4 and act to support a loaded wafer 2. The wafer stopper hole 8 has inserted into it a wafer stopper 9 whose height extends beyond the top portion of the wafer supporting section 6.

As shown in FIG. 2, the conventional wafer holder 10 is placed at an end portion of a cleaning arm 7 which rotates in the counterclockwise direction along an angle of 120°. The wafer 2 is loaded/unloaded into/out of the wafer holder 10 in cooperation with a transfer belt (not shown). During loading, the wafer 2 is guided by the wafer guiding section 4 and is then loaded onto the wafer support section 6. The wafer stopper 9 moves up and down within the wafer stopper hole 8 to control the loading/unloading operation of the wafer 2.

However, since the conventional wafer holder 10 is generally made of the silicon oxide material, it can easily break because if friction or other interference between the wafer stopper 9 and other elements of the wafer holder 10. This is especially possible given the up and down movement of the wafer stopper 9 and the cleaning arm 7. In addition, since the size of the wafer stopper hole 8 is small, the wafer stopper 9 may become stuck or bent because of a mismatch between the wafer stopper 9 and the wafer stopper hole 8. In this case, the friction or interference can cause a large amount of particles to be formed, which can in turn contaminate or otherwise damage the wafer 2. Moreover, since the width of the wafer support section 6 is small, when the wafer stopper 9 and the cleaning arm 7 are not accurately positioned with respect to each other, the wafer 2 may be erroneously placed on the inclined surface of the wafer guiding section 4. This misalignment can result in the wafer not being flat and can cause serious deposition problems.

SUMMARY OF THE INVENTION

Accordingly, it is an object of the present invention to provide a wafer holder which overcomes the problems encountered in the conventional wafer holder.

It is another object of the present invention to provide an improved wafer holder that more stably supports the transferred wafer and prevents interference between a wafer stopper and other elements of the wafer holder.

To achieve the above objects, there is provided a wafer holder which includes a wafer guiding section having a centrally and inwardly inclined surface for stably guiding a wafer; a wafer support section formed at an inner side of the wafer guiding section and having a flat surface for supporting the wafer; one or more wafer stopper holes formed between the wafer guiding section and the wafer support section, the wafer stopper holes being wider in the circumferential direction of the wafer support section than in the radial direction; and one or more the wafer stoppers inserted in the one or more wafer stopper holes for preventing undesired movement of the wafer.

In addition, the wafer holder may comprise a metallic material. More particularly, the wafer holder may comprise stainless steel.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENT

Figure 1:
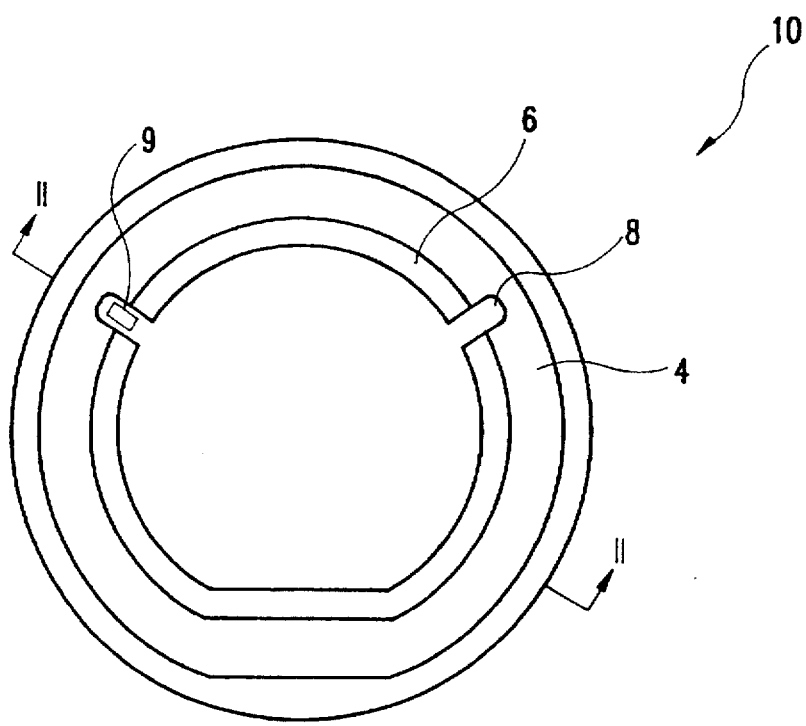
FIG. 1 is a plan view illustrating a conventional wafer holder.
Figure 2:
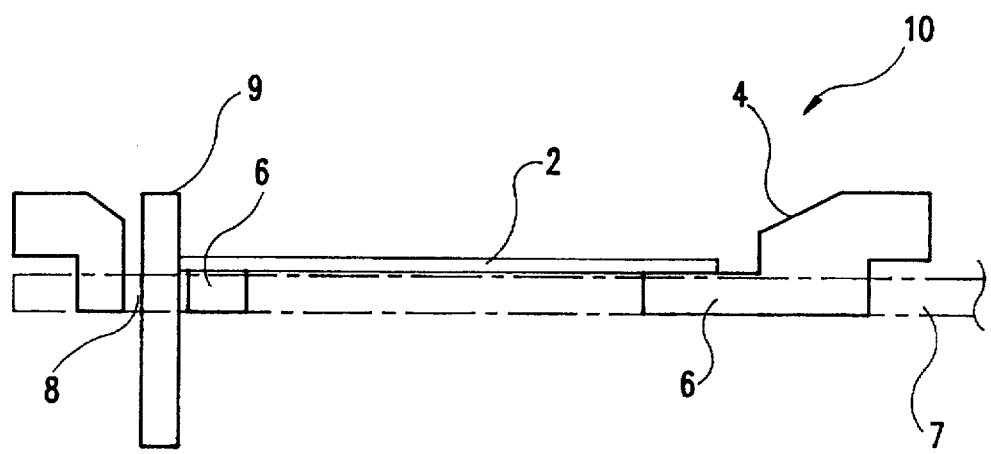
FIG. 2 is a cross-sectional view taken along line II—II of FIG. 1 and illustrating a loaded wafer.
Figure 3:
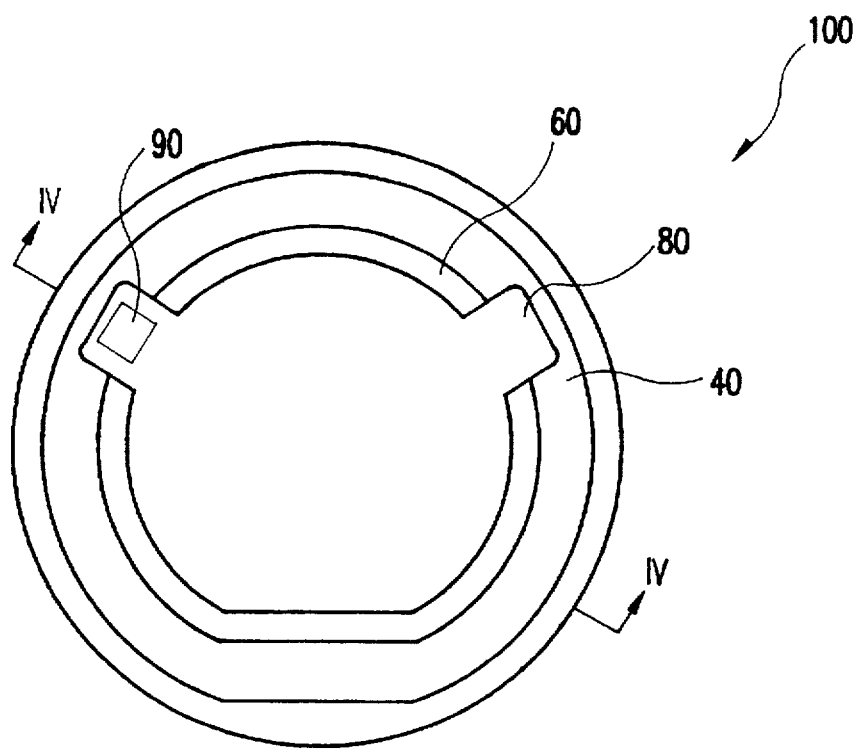
FIG. 3 is a plan view illustrating a wafer holder according to a preferred embodiment of the present invention.
Figure 4:
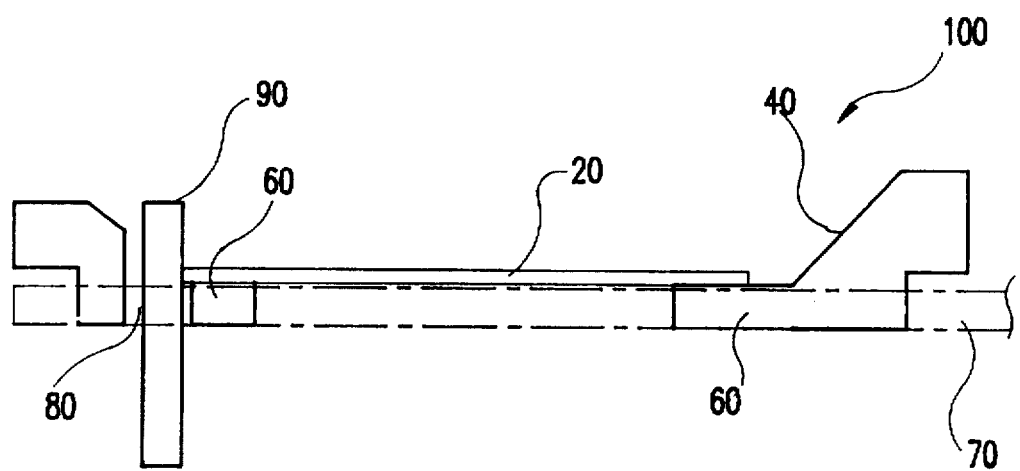
FIG. 4 is a cross-sectional view taken along line IV—IV of FIG. 3 and illustrating a loaded wafer according to a preferred embodiment of the present invention.

FIG. 3 is a plan view illustrating a wafer holder according to a preferred embodiment of the present invention. FIG. 4 is a cross-sectional view taken along line IV—IV of FIG. 3 and illustrating a loaded wafer according to a preferred embodiment of the present invention.

As shown in FIGS. 3 and 4, a wafer holder 100 according to a preferred embodiment of the present invention is preferably made of a metallic material such as a stainless steel, and includes a wafer guiding section 40, a wafer support section 60, and a pair of spaced-apart rectangular wafer stopper holes 80. In this embodiment the wafer holder 100 is attached to an arm 70 for moving the wafer holder 100.

The wafer guiding section 40 includes a centrally and inwardly inclined surface for stably guiding the wafer 20 into the wafer support section. Preferably the wafer is loaded into the wafer holder 100 from a transfer belt (not shown). The wafer support section 60 has a predetermined width suitable for stably supporting the wafer 20.

A pair of spaced-apart rectangular wafer stopper holes 80 are formed at a portion between the wafer support section 60 and the wafer guiding section 40 and act to minimize the friction and interference between the wafer stopper 90 and the wafer stopper holes 80. This friction is generally caused by the wafer stopper 90 bending as it moves up and down in the wafer stopper holes 80. Additional interference or friction is caused by position mismatch between the arm 70 and the wafer stopper 90. In this embodiment, the rectangular wafer stopper holes 80 have a predetermined size that is wider in the circumferential direction of the wafer support section 60 than in the radial direction.

The operation and effects of the wafer holder 100 according to the present invention will be explained with reference to the accompanying drawings.

First, before the wafer 20 is loaded in the wafer holder 100, the wafer stopper 90 is raised such that it is above the top portion of the wafer stopper hole 80. Afterwards, the wafer 20 is transferred to the wafer holder 100 through a transfer belt (not shown), and the wafer stopper 90 stops the horizontal movement of the wafer 20. At this time, the wafer 20 is guided by the softly inclined surface of the wafer guiding section 40 into the wafer support section 60.

Thereafter, the wafer stopper 90 is lowered, and the arm 70 supporting the wafer holder 100 is lifted. The arm 70 then rotates about 120° in the counterclockwise direction, and transfers the wafer 20 to a predetermined processing chamber.

The operation of the wafer holder mentioned above is similar to that in the conventional art. However, since the wafer holder 100 is made of a metallic material such as stainless steel, the wafer holder 100 can not be easily broken down by friction or any other interference between the wafer stopper 90 and other elements of the wafer holder 100. Thus, regardless of the operation of the wafer stopper 90 and the arm 70 moving up and down, there is no production of particles in the system.

In addition, since the wafer stopper holes 80 are bigger in a circumferential direction than in a radial direction, no interference occurs between the wafer stopper 90 and other elements of the wafer holder 100. There is no bending or twisting of the wafer stopper 90 and the arm 70, and therefore no friction or interference there.

Since the surface of the wafer guiding section 40 is softly and inwardly inclined at a predetermined angle, the wafer 20 can be more stably guided, and since the width of the wafer support section 60 is wider than the conventional wafer support section, it is possible to more effectively prevent an inaccurate loading of the wafer and the twist of the same.

Therefore, in accordance with the wafer holder according to the present invention, the fabrication cost reduction and operation rate can be significantly enhanced by more stably loading/unloading the wafer to the wafer holder, for thus increasing the semiconductor fabrication yield.

The present invention is not limited to the above-described embodiments. Various changes and modifications may be effected by one having an ordinary skill in the art and remain within the scope of the invention, as defined by the appended claims.

What is claimed is:

1. A wafer holder, comprising:
   a wafer guiding section having a centrally and inwardly inclined surface for stably guiding a wafer;
   a wafer support section formed at an inner side of the wafer guiding section and having a flat surface for supporting the wafer;
   one or more wafer stopper holes formed between the wafer guiding section and the wafer support section, the wafer stopper holes being wider in the circumferential direction of the wafer support section than in the radial direction; and
   one or more of the wafer stoppers inserted in the one or more wafer stopper holes for preventing undesired movement of the wafer.

2. The wafer holder as recited in claim 1, wherein the wafer holder comprises a metallic material.

3. The wafer holder as recited in claim 2, wherein the wafer holder comprises stainless steel.

4. A wafer holder, comprising:
   a wafer guiding section having a centrally and inwardly inclined surface for stably guiding a wafer;
   a wafer support section formed at an inner side of the wafer guiding section and having a flat surface for supporting the wafer;
   one or more wafer stopper holes formed between the wafer guiding section and the wafer support section; and
   one or more the wafer stoppers inserted in the one or more wafer stopper holes for preventing undesired movement of the wafer,
   wherein the wafer holder comprises a metallic material.

5. The wafer holder as recited in claim 4, wherein the wafer holder comprises stainless steel.

* * * * *